United States Patent [19]

Shuto et al.

[11] Patent Number: 5,192,371
[45] Date of Patent: Mar. 9, 1993

[54] SUBSTRATE SUPPORTING APPARATUS FOR A CVD APPARATUS

[75] Inventors: Mitsutoshi Shuto; Yasushi Fukazawa, both of Tokyo; Minoru Ohsaki, Kumamoto, all of Japan

[73] Assignee: ASM Japan K.K., Tokyo, Japan

[21] Appl. No.: 703,809

[22] Filed: May 21, 1991

[51] Int. Cl.$^5$ .............................................. C23C 16/46
[52] U.S. Cl. .................................... 118/728; 118/715; 118/500
[58] Field of Search ..................... 118/715, 500, 728

[56] References Cited
FOREIGN PATENT DOCUMENTS 50-81677   7/1975  Japan .
63-181315  7/1988  Japan .
63-177035  11/1988 Japan .
1-168030   7/1989  Japan .

Primary Examiner—Richard Bueker
Attorney, Agent, or Firm—Knobbe, Martens, Olson & Bear

[57] ABSTRACT

A substrate supporting apparatus having a plurality of support plates positioned in parallel for supporting a plurality of substrates to be treated. The plates (13), (23) and (33) have respectively central openings (14), (24) and (34) which differ in size, and have respectively a plurality of clips (15), (25) and (35) along the periphery of the opening to support a substrate above the opening. The sizes of said openings (14, 24, 34) are determined depending upon reactive gas condition (e.g., temperature, pressure, flow characteristics of reactive gas) so that a uniform thin film can be formed on each substrate and an impurity introduced into the thin film can have a suitable concentration.

3 Claims, 3 Drawing Sheets

REACTIVE GAS →

SUBSTRATE SUPPORTING APPARATUS FOR A CVD APPARATUS

DESCRIPTION OF THE INVENTION

1. Technical Field

This invention pertains to an apparatus for supporting a plurality of substrates like semiconductor wafers and so on, and a CVD apparatus which deposits a predetermined thin film on substrates by using the supporting apparatus.

2. Background Art

Recently, electronic parts used in machines for office automation, televisions, computers and so on have been rapidly developed. Semiconductor devices are used in such electronic parts. In process for making semiconductor devices, a CVD apparatus is used in order to deposit a thin film like an oxide film or polycrystalline silicon film on a semiconductor substrate. In such a CVD apparatus, there is a vertical-type CVD apparatus in which a plurality of substrates are arranged vertically and a horizontal-type CVD apparatus in which a plurality of substrates are arranged horizontally. Such type of CVD apparatus can treat a plurality of substrates at once.

A partly sectional fragmentary schematic illustration of a prior art horizontal CVD apparatus is shown in FIG. 3. A substrate supporting apparatus A, which has four supporting bars 2 and a plurality of support plates 3 supported in parallel by the bars 2, is positioned in a bell-jar type silicon tube 1.

FIG. 4 illustrates the support plate 3 supporting substrates and FIG. 5 shows a fragmentary sectional view of the substrate supporting apparatus in which the plates are positioned equally and in parallel. The plates have the same structure and similar central openings. FIG. 5 illustrates three support plates, but the illustrated plates are a part of plural plates positioned in parallel. As shown in FIG. 4, each of the plates has a central opening 4, and has plural clips 5 for supporting substrate 6 along the periphery of the opening. The openings are substantially identical. The reason the substrates are supported by such plates is as follows. That is, as shown in FIG. 5, a reactive gas necessary to deposit a thin film on a substrate does not only flow from between the support plates into the substrate but also flows from an opening of a plate positioned over the plate which supports the substrate into the substrate. The reactive gas reaches comparatively uniformly the substrate, thus a thin uniform film can be deposited on the substrate.

However, the CVD apparatus in which such a substrate supporting apparatus is incorporated has the following disadvantages.

In the substrate supporting apparatus A having identical plates which are positioned equally and in parallel, as shown in FIG. 5, it is possible to deposit a uniform thin film on each of the substrates on condition that a reactive gas among the plates is in the same condition everywhere. However, flow characteristics, temperature, pressure of such a reactive gas which flows around support plates positioned upstream are different from those of the reactive gas which flows around support plates positioned downstream. In this sense, upstream refers to the region closer to the source of reactive gas, and downstream to the region farther from the source. In a result, a central part of a film deposited on the substrates positioned upstream is thicker than a peripheral part of the film, and a peripheral part of a film deposited on the substrates positioned downstream is thicker than a central part of the film. Such a film is deposited on substrates positioned upstream and substrates positioned downstream in a horizontal-type CVD apparatus, too. Deposition of such a uniform film cannot be tolerated in semiconductor manufacture in which it is required to precisely deposit a uniform film on a substrate.

It is therefore an objective of the present invention to provide a substrate supporting apparatus for treating simultaneously plural semiconductor substrates in a CVD apparatus, improving uniformity of a thin film deposited on the substrates and/or controlling properly a concentration of an impurity to be introduced in the film.

DISCLOSURE OF INVENTION

According to the present invention, the above objects are achieved in a substrate supporting apparatus comprising a plurality of support plates positioned in parallel for supporting a plurality of substrates to be treated, respectively. Each of the support plates has a central opening, and has plural clips along the periphery of the opening to carry a substrate above the opening. The openings in the support plates differ with respect to each other so that the uniformity of thin-film deposition is improved.

A CVD apparatus of the present invention includes said substrate supporting apparatus.

The substrate, support plates and openings in the support plates may be circular or polygonal. A substrate to be treated is not limited to a semiconductor, for example, may be a glass substrate, or a ceramic substrate.

A space needed to deposit a uniform thin film on a substrate under various conditions (e.g., temperature, pressure, flow characteristics and so on) of a gas or gases surrounding the substrate is defined by varying the size of an opening in a support plate of a substrate supporting apparatus of the present invention so that treatment of a plurality of substrates, that is uniform thin film deposition, can be achieved. The present invention can control properly a concentration of an impurity to be introduced in the film too.

BEST MODE FOR CARRYING OUT THE INVENTION

Figure 1:
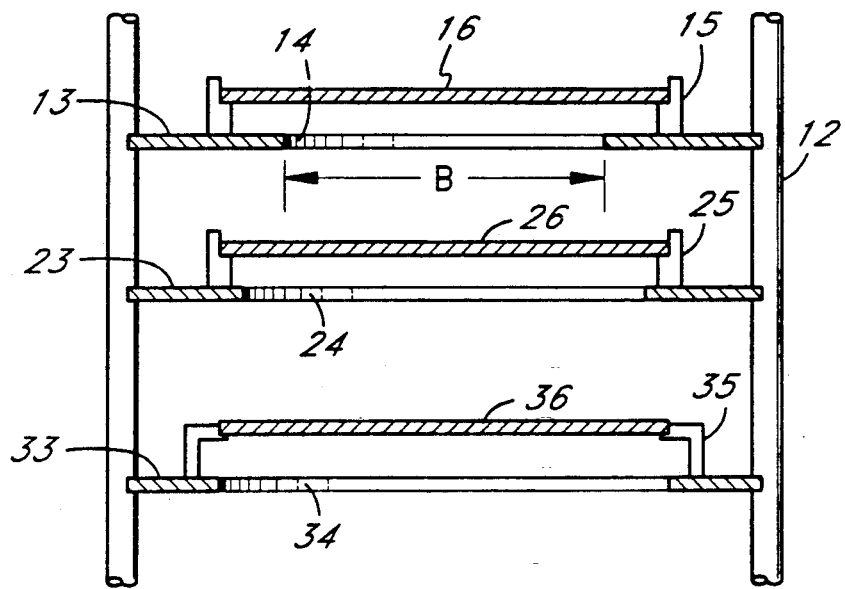
FIG. 1 is a partially sectional view of the substrate supporting apparatus according to the invention.

FIG. 1 is a partially sectional view of the substrate supporting apparatus according to the invention which is incorporated in a vertical CVD apparatus. FIG. 1 shows only three support plates 13, 23, 33 carried in parallel by supporting bars, actually the number of support plates to be properly positioned in a CVD apparatus depends on the volume of a CVD apparatus to be used. The basic structure of each of these support plates is the same as one of the support plates shown in FIG. 4.

Figure 4:
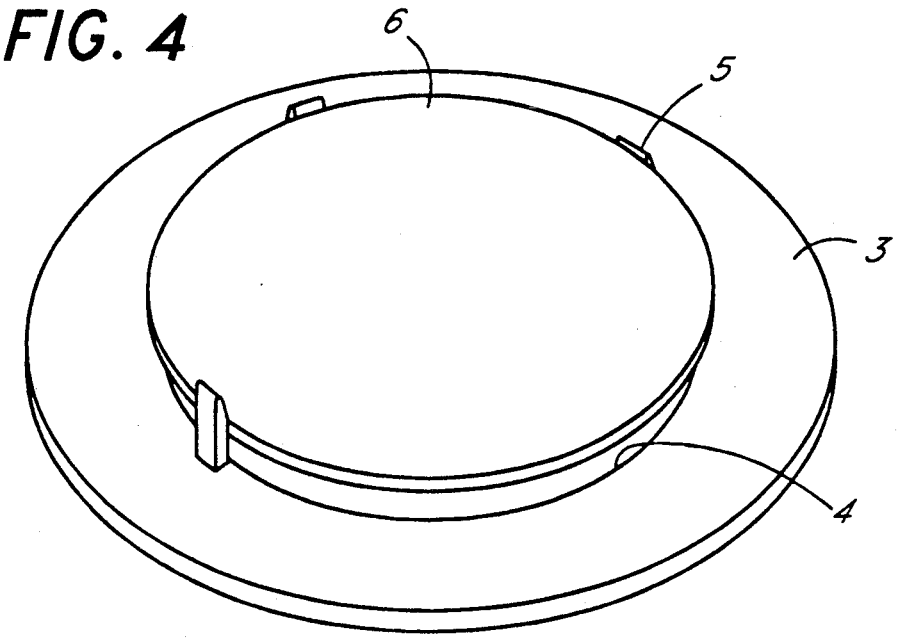
FIG. 4 is a perspective view of support plates in a prior art substrate supporting apparatus.

The plates 13, 23, 33 supporting substrates, as well as the plates shown in FIG. 4 are circular, but are not limited to be circular, they may be polygonal. However, if substrates to be treated are circular, these plates are preferably circular as well.

The plates 13, 23, and 33 have central openings 14, 24, and 34, respectively through which a reactive gas may flow. These openings are circular, since the substrates are circular. Clips for supporting a substrate above the plate are mounted on the plate along the periphery of the opening. The number of clips should be determined in view of reliability in clipping a substrate and facility in attaching or removing a substrate, and preferably is three. By the clips, a substrate is supported right above the opening of the support plate.

The substrate is a semiconductor wafer, but is not limited to such a semiconductor wafer, for example may be a glass substrate, or a ceramic substrate.

Figure 5:
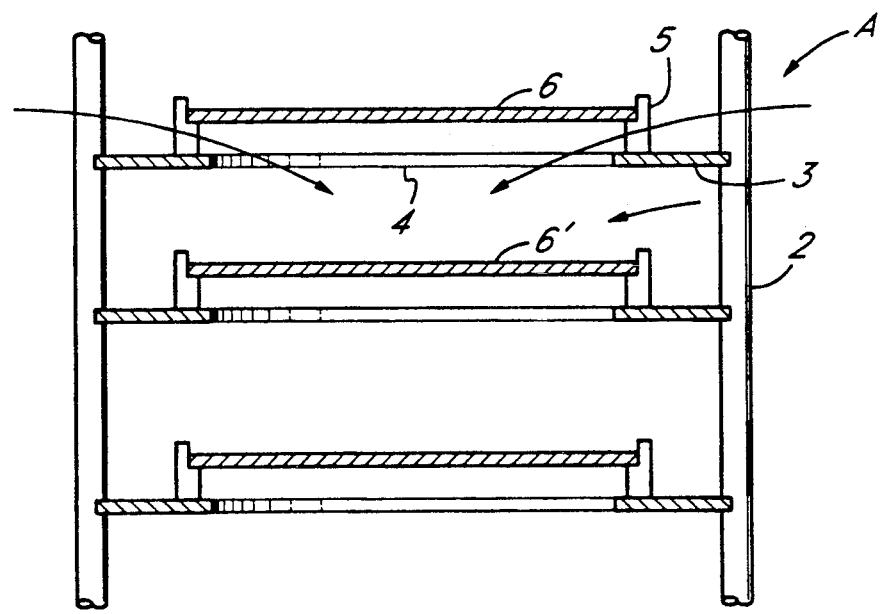
FIG. 5 is a partially sectional view of a prior art substrate supporting apparatus.

The structure of the plates of the substrate supporting apparatus of the present invention is basically the same as the structure of the prior art plate shown in FIG. 4. Making a comparison between FIG. 1 and FIG. 5, the difference between the substrate supporting apparatus of the present invention and the prior art substrate supporting apparatus is clear, that is, that openings in the plates of the prior art apparatus are the same, on the other hand openings in the plates of the apparatus of the present invention are different from each other.

Figure 3:
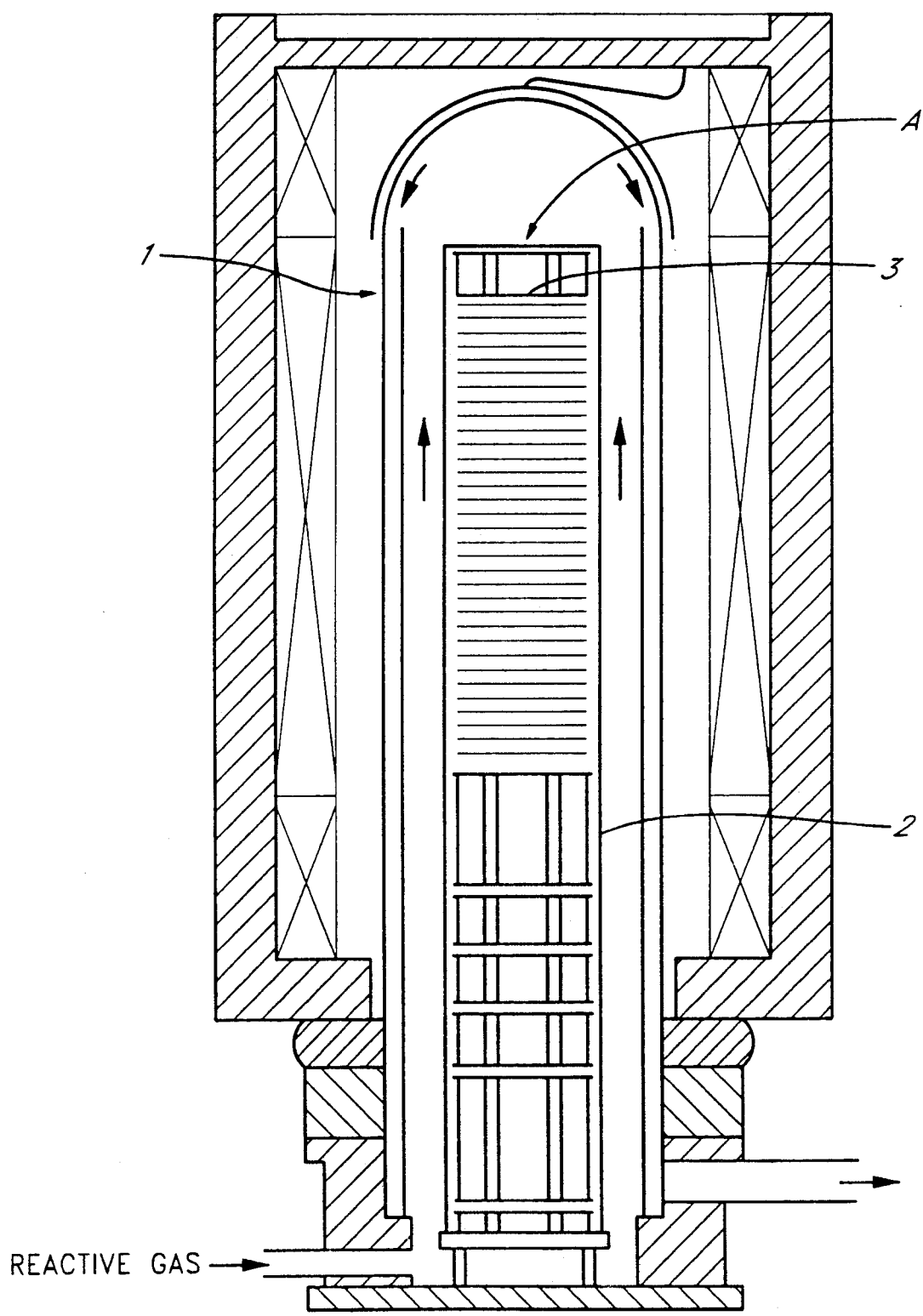
FIG. 3 is a sectional schematic view of a bell-jar CVD apparatus, including a prior art substrate supporting apparatus.

In the preferred embodiment (FIG. 1) of the substrate supporting apparatus incorporated in the vertical CVD apparatus shown in FIG. 3, the sizes of openings 14, 24, and 34 in the plates 13, 23, and 33 increase gradually (for example, when a semiconductor wafer is 150 mm in diameter, the opening in the highest plate is 146 mm in diameter and the opening in the lowest plate is 158 mm in diameter). In some instances, when the size of openings increase, such as in FIG. 1, the opening 34 in the support plates 33 becomes larger than the substrate 36 In this case, the substrate 36 is supported by inverse L-shaped clips 35.

A space above a substrate needed to deposit a uniform thin film on the substrate which depends on various conditions (e.g., temperature, pressure, flow characteristics and so on) of a gas or gases surrounding the substrate is defined above the substrate by changing the size of the opening (B shown in FIG. 1) of the support plate positioned above the substrate. However, since the sizes of openings in the support plates should be changed to define the above-mentioned space above the substrate to be treated, all the sizes of the openings need not be different from each other. In the simplest embodiment, upper half of the support plates have the same small openings, respectively, and lower half of the support plates have the same large openings, respectively.

FIG. 1 shows a substrate supporting apparatus having support plates with an opening. As shown in FIG. 1, the more downstream the support plates are positioned, the larger the openings become, this is one embodiment incorporated into a general vertical CVD apparatus. If conditions of the reactive gas surrounding each of support plates change depending upon CVD apparatus type to be used, the number of substrates to be treated, the kind of reactive gas, reaction condition, treating time and so on, each of the sizes (B) of the support plates need be varied according to the change of the gas conditions.

Therefore, in one embodiment, the openings in the upper and lower plates are smallest and the openings in the middle plates are largest, in other embodiment, the opening in the upper plate is largest and the opening in the lower plate is smallest.

The sizes of the support plates of the substrate supporting apparatus should be individually determined according to operation condition of the CVD apparatus.

It is apparent that a substrate supporting apparatus which has a plurality of support plates having different central openings, respectively, according to the present invention, also can control properly a concentration of an impurity to be introduced in a film on the substrate.

Figure 2:
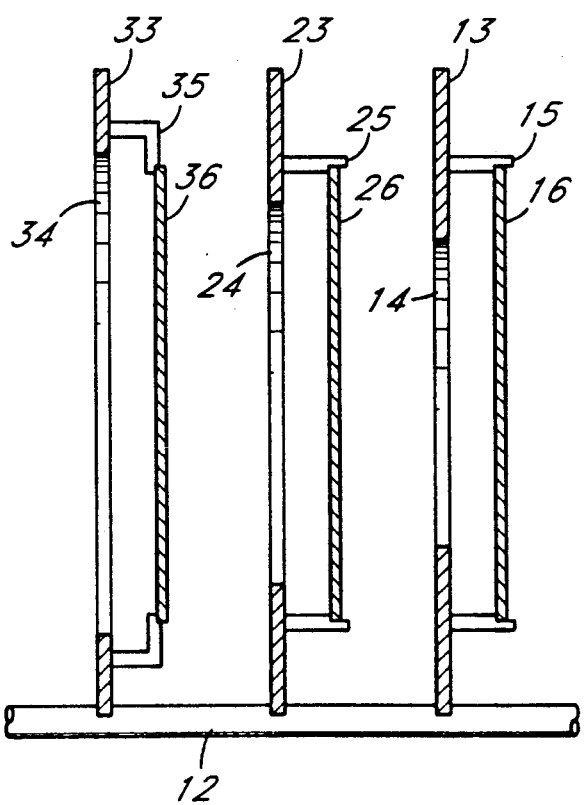
FIG. 2 is a partially sectional view of the alternative embodiment of the substrate supporting apparatus according to the invention incorporated in a hot-wall type CVD apparatus.

FIG. 2 shows an alternative embodiment of the present invention and is a partially sectional view of the substrate supporting apparatus incorporated in a hot-wall type CVD apparatus, which comprises a plurality of support plates 13, 23, and 33 arranged in vertical and in parallel for supporting substrates 16, 26, 36 by means of clips 15, 25, 35.

Industrial Applicability

As explained, the substrate supporting apparatus of the present invention is suitable to a CVD apparatus for depositing a uniform thin film on a substrate or controlling a concentration of an impurity to be introduced in a thin film deposited on a substrate depending upon conditions of a reactive gas (temperature, pressure, flowing).

We claim:

1. A CVD apparatus for depositing a thin film on a plurality of substrates, characterized in that substrate supporting apparatus having a plurality of support plates positioned in parallel for supporting a plurality of substrates is positioned in the CVD apparatus, each of said plates having a central opening and a plurality of clips along the periphery of the opening for supporting a substrate above the opening, said CVD apparatus including means for providing reactive gas to the plurality of substrates, said openings in said plates having different sizes with respect to the other openings the sizes of which are determined by flow characteristics of said reactive gas in said CVD.

2. A CVD apparatus for depositing a thin film on a plurality of substrates as defined in claim 1, wherein said relative size of said openings in said plates is a function of parameters of said reactive gas which includes a flow characteristics, a temperature and a pressure of said reactive gas so as to form a uniform and identical thin film on each of said substrates.

3. A CVD apparatus for depositing a thin film on a plurality of substrates as defined in claim 1, wherein said plurality of clips for supporting said substrates are formed in different shapes in accordance with said relative size of said openings on said plates.

* * * * *

UNITED STATES PATENT AND TRADEMARK OFFICE
CERTIFICATE OF CORRECTION

PATENT NO. : 5,192,371
DATED : March 9, 1993
INVENTOR(S) : Mitsutoshi Shuto, et al.

It is certified that error appears in the above-identified patent and that said Letters Patent is hereby corrected as shown below:

On the title page: Item [73] Assignee, add --NEC Corporation, Tokyo Japan-- as a second Assignee.

Signed and Sealed this

Third Day of November, 1998

Attest:

Attesting Officer

BRUCE LEHMAN

Commissioner of Patents and Trademarks